US007186945B2

(12) United States Patent
He et al.

(10) Patent No.: US 7,186,945 B2

(45) Date of Patent: Mar. 6, 2007

(54) SPRAYABLE ADHESIVE MATERIAL FOR LASER MARKING SEMICONDUCTOR WAFERS AND DIES

(75) Inventors: Xiping He, Cerritos, CA (US); Torey Tomaso, Ladera Ranch, CA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 244 days.

(21) Appl. No.: 10/685,818

(22) Filed: Oct. 15, 2003

(65) Prior Publication Data

US 2005/0082338 A1 Apr. 21, 2005

(51) Int. Cl.
*B23K 26/00* (2006.01)
*H01L 21/70* (2006.01)

(52) U.S. Cl. ................................. 219/121.69; 438/106

(58) Field of Classification Search ........... 219/121.68, 219/121.69, 121.85; 228/101; 438/14, 401, 438/106

See application file for complete search history.

(56) References Cited

U.S. PATENT DOCUMENTS 4,061,820 A * 12/1977 Magid et al. ............ 428/317.3
4,344,006 A 8/1982 Mendelsohn
5,641,997 A * 6/1997 Ohta et al. .................. 257/788
6,175,162 B1 1/2001 Kao et al.
6,177,093 B1 * 1/2001 Lombardi et al. .......... 424/401
6,432,796 B1 * 8/2002 Peterson ..................... 438/401
6,524,881 B1 * 2/2003 Tandy et al. .................. 438/69
6,824,849 B2 * 11/2004 Herzog et al. ............. 428/40.1
2001/0035588 A1 * 11/2001 Aga ........................... 257/788
2002/0096491 A1 * 7/2002 Tandy et al. .................. 216/44
2003/0189814 A1 * 10/2003 Kato et al. .................. 361/715

FOREIGN PATENT DOCUMENTS

EP 0 590975 6/1994
JP 359175751 A * 10/1984
JP 62005885 A * 1/1987
JP 402130947 A * 5/1990
JP 403093240 A * 4/1991
JP 06045414 A * 2/1994
JP 407304251 A * 11/1995
JP 408132258 A * 5/1996
JP 409277700 A * 10/1997
JP 02000075794 A * 3/2000

* cited by examiner

*Primary Examiner*—Samuel M. Heinrich
(74) *Attorney, Agent, or Firm*—Jane E. Gennaro

(57) ABSTRACT

A sprayable adhesive composition having a viscosity within the range of 0.5 Pa.s to 5.0 Pa.s, containing at least one colored filler present in an amount up to 50% by weight of the adhesive composition, is suitable for marking identifications or fiducials on semiconductor dies or wafers. The preferred resins include epoxy resins or combinations of an electron donor resin and an electron acceptor resin.

2 Claims, No Drawings

SPRAYABLE ADHESIVE MATERIAL FOR LASER MARKING SEMICONDUCTOR WAFERS AND DIES

FIELD OF THE INVENTION

This invention relates to a material for laser marking semiconductor wafers, dies and devices.

BACKGROUND OF THE INVENTION

In the fabrication of microelectronic devices, many of the operations are performed using machines with machine-vision technology. Semiconductor dies and packaged semiconductor dies are marked with fiducials and identification marks that are readable by these machines, allowing the dies to be accurately identified and positioned on a chosen substrate, such as a circuit board. A preferred method of marking is to use a laser to inscript the fiducial or identification mark. This can be done on the inactive face of the die, which changes the color of the silicon, or on a marking film applied to the inactive face of the die or wafer. As dies and wafers become thinner, their physical integrity can be compromised by either of these methods; thus, there is a need for a marking medium that can be applied without physically jeopardizing the die or wafer.

SUMMARY OF THE INVENTION

This invention is an adhesive solution or dilute paste that can be applied to a die or wafer without physically contacting the die or wafer, and be inscripted by a laser for marking or identification. The adhesive solution or paste contains one or more colored fillers and is applied by spraying onto the non-active surface of the wafer or single die. The adhesive can be any adhesive that is currently used under similar fabrication steps for semiconductor packages, although epoxies or electron donor and electron acceptor adhesive systems are preferred. In addition to facilitating laser marking, the adhesive provides mechanical support, and protection from electrostatic shock and light induced bias.

DETAILED DESCRIPTION OF THE INVENTION

Suitable fillers can be either light or dark colored pigments or dyes that are inert, have a particle size under 50 microns, preferably under 1 micron, are easily dispersible, nonabrasive and ionically clean. A preferred light colored filler is titanium dioxide; a preferred dark colored filler is carbon black, grade channel black. Alternatively, colored pigments and dyes can be used as fillers, and in those cases, color instead of symbols can act as the identifying mark. The following table lists various colors and the chemical composition of the pigment or dye to give those colors.

| | |
|---|---|
| Crimson | Anthraquinonoid, Dioxazine |
| Crimson | Anthraquinone |
| Crimson | Anthraquinone |
| Crimson | 1:2 Dihydroxyanthraquinone Lake |
| Crimson | Quinacridone Pyrrolidone |
| Crimson | Quinacridone Pyrrolidone, Quinacridone |
| Black | Specified Carbon Black |
| Black | Carbon Black |
| Blue | Copper Phthalocyanine |
| Blue | Phthalocyanine Blue |

-continued

| | |
|---|---|
| Blue | Ultramarine Blue |
| Ultramarine Blue | Complex Silicate of Sodium and Aluminum with Sulfur |
| Deep Blue | Phthalocyanine Complex |
| Deep Blue | Complex of Sodium—Aluminum—Silica containing Sulphur, Phthalocyanine Alpha |
| Light Blue | Phthalocyanine, Titanium [Dioxide] |
| Light Blue | Titanium Dioxide, Chlorinated Phthalocyanine, Phthalocyanine Beta |
| Light Blue | Zinc Oxide, Phthalocyanine Beta |
| Blue Violet | Dioxazine, Quinacridone |
| Bright Green | Arylide Yellow 10G, Chlorinated Copper Phthalocyanine, Zinc Oxide |
| Brown | Monoazo Complex |
| Brown | Benzimidazolone |
| Carmine | Napthol Carbamide |
| Carmine | Naphthol ITR |
| Carmine | Quinacridone Red |
| Carmine | Quinacridone Pyrrolidone |
| White | Zinc Oxide |
| Cyan | Phthalocyanine Blue |
| Dark Yellow | Arylide Yellow RN |
| Geranium | Quinacridone, Anthraquinone |
| Geranium | Chlorinated Para Red, Quinacridone |
| Green | Phthalocyanine Green, Diarylide Yellow |
| Green | Phthalo Green, Arylide Yellow 10G |
| Green | Phthalo Green, Zinc White |
| Green | Phthalocyanine Green |
| Green | Phthalo Green, Monoazo Yellow |
| Green | Cadmium Sulfide, Cobalt Oxide |
| Green | Zinc Oxide, Titanium Dioxide Rutile, Stable Monoazo, Phthalocyanine |
| Green | Arylamide Yellow, Synthetic Iron Oxide, Chlorinated Copper Phthalocyanine |
| Green | Hydrated Chromium Oxide, Cadmium Sulfide |
| Green | Hansa Yellow 10G, Phthalocyanine Beta |
| Green | Disazo Pigment, Copper Phthalocyanine, Nickel-Antimony Titanate |
| Green | Benzimidazolone, Phthalocyanine Green |
| Green | Polychloro Copper Phthalocyanine, Nickel-Antimony Titanate, Monoazo Pigment |
| Green | Nickel-Antimony Titanate, Disazo Pigment, Polychloro Copper Phthalocyanine |
| Green | Nickel-Antimony Titanate, Monoazo Pigment, Copper Phthalocyanine |
| Deep Green | Nickeltitanium, Phthalocyanine |
| Deep Green | Phthalocyanine Green, Arylide Yellow FGL, Titanium Dioxide |
| Deep Green | Chlorinated Phthalocyanine, Arylide Yellow, Titanium Dioxide |
| Deep Green | Chlorinated Copper Phthalocyanine, Arylamide Yellow |
| Deep Green | Polychloro Copper Phthalocyanine |
| Deep Green | Phthalocyanine with Extender |
| Deep Green | Trisulfonated Copper Phthalocyanine Lake, Monoazo Pigment, Polychloro Copper Phthalocyanine |
| Deep Green | Zinc Sulfide/Barium Sulfate, Monoazo Yellow, Phthalocyanine Blue, Metal Complex |
| Deep Green | Chlorinated Copper Phthalocyanine, Arylamide Yellow |
| Deep Green | Zinc Sulfide/Barium Sulfate, Monoazo Yellow, Phthalocyanine Green |
| Deep Green | Arylide Yellow, Chlorinated Copper Phthalocyanine |
| Deep Green | Disazo Pigment, Copper Phthalocyanine |
| Deep Green | Zinc Oxide, Titanium Dioxide Rutile, Synthetic Ultramarine B29, Phthalocyanine, Stable Di-Arylide |
| Deep Green | Hydrated Chromium Oxide, Phthalocyanine Green |
| Deep Green | Chlorinated Copper Phthalocyanine, Arylamide Yellow |
| Deep Green | Chlorinated Phthalocyanine, Complex of Sodium—Aluminum—Silica containing Sulphur, Cadmium Sulfide |
| Deep Green | Chlorinated Phthalocyanine, Phthalocyanine Alpha, Hansa Yellow 10G |
| Deep Green | Complex of Sodium—Aluminum—Silica containing Sulphur, Chlorinated Phthalocyanine |

-continued

| | |
|---|---|
| Deep Green | Hydrated Chrome Oxide |
| Deep Green | Arylide, Copperphthalocyanine |
| Deep Green | Arylide, Copperphthalocyanine |
| Light Green | Phthalocyanine, Arylamide |
| Light Green | Arylide Yellow, Chlorinated Copper Phthalocyanine |
| Light Green | Concentrated Cadmium Zinc Sulfide, Chlorinated Copper Phthalocyanine |
| Light Green | Phthalocyanine, Titanium [Dioxide] |
| Light Green | Cadmium Sulfide, Chlorinated Phthalocyanine |
| Light Green | Titanium Dioxide, Arylamide Yellow, Copper Phthalocyanine, Arylamide Yellow |

an appropriate energy for the pigment or dye present in the adhesive. If the laser energy is fixed, the pigment or dye can be chosen based on a refractive index that will correspond to the wavelength of the laser. Conventionally, the lasers used within the microelectronics industry for marking semiconductor dies and packages have a wavelength of 1064 nm or 532 nm.

Fluorescent color brighteners can be added to enhance the optical clarity and optical pick-up recognition of the fillers. An example of a fluorescent brightener or color enhancer is Calcofluor M2R, supplied by Sigma-Aldrich, with a preferred loading level of 0.1 to 2.0% by weight. The structure of Calcofluor is:

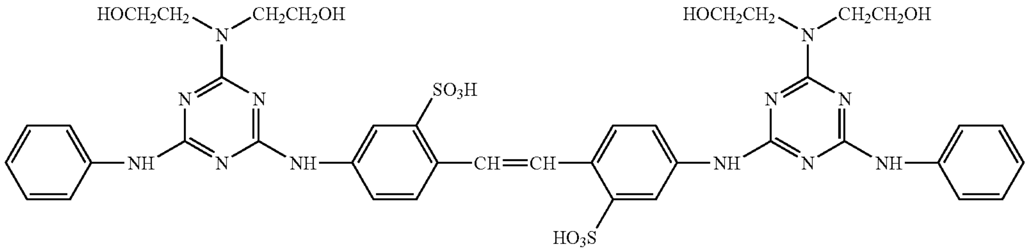

-continued

| | |
|---|---|
| Light Green | Arylide Yellow, Phthalo Green, Zinc White |
| Light Green | Chlorinated Copper Phthalocyanine, Arylamide Yellow |
| Light Green | Monoazo Pigment, Polychloro Copper Phthalocyanine |
| Light Green | Monoazo Pigment, Polychloro Copper Phthalocyanine |
| Light Green | Zinc Sulfide/Barium Sulfate, Monoazo Yellow, Phthalocyanine Green |
| Light Green | Chlorinated Copper Phthalocyanine, Arylamide Yellow |
| Light Green | Monoazo Yellow, Phthalocyanine Blue |
| Light Green | Phthalo Green, Monoazo Yellow |

Either a single colored or light or dark filler, or one or more contrasting colored fillers, may be used. In those adhesives where more than one color pigment or dye is used, the different colors, after being blended into the adhesive, will naturally tend to segregate together making distinct layers by physical or chemical affinities. In most cases, the separation and segregation will occur due to gravity.

In the case where a single colored filler is used, the filler is preferably a dark colored filler because the laser energy is absorbed more strongly by a dark layer than by a light layer. This increased energy absorption makes it faster to cut through a dark layer than through a light layer. When two or more contrasting colored fillers are used, the lighter or lightest colored filler should be chosen to be heaviest or densest filler so that it settles proximate to the die or wafer. Because a dark filler is cut or burned out by the laser easier and faster than a light filler would be, when the laser reaches the light colored filler the laser cut or burn out will slow considerably or halt. As a result, the depth of the laser cut or burn is to some extent self-regulating.

As will be recognized by those skilled in the art, different pigments and dyes have different refractive indices and energy absorption rates. Therefore, the laser chosen for accomplishing the marking or identification can be tuned to The colored filler or fillers are dispersed into the adhesive resin by using a high shear mixer (in the range of 3000 to 5000 rpm) and/or a triple roll mixer. Shearing continues until the filler is stabilized within the adhesive. Preferred loading levels range from 5 to 50 percent by weight for each of the dark and light fillers and can be varied by the practitioner depending on the color configuration desired. The higher loading range typically would be used for higher levels of UV or light shielding required for some photosensitive devices. The filled adhesive is applied by spraying onto the wafer or individual dies. A preferred spray head is Asymtek EFD 780S-ss spray head. Deposition can be accomplished by spraying in a back and forth motion conforming to the shape of the wafer or die, or in concentric circles. With minimal practice, the limits of the spray motion can be determined so that excess adhesive does not contaminate the active surface of the wafer or die. Sufficient adhesive is deposited to leave a layer after cure within the range of 12.5 μm to 150 μm; a referred range is 25 μm to 50 μm.

Preferred adhesives include epoxy resins; acrylic resins; and bismaleimide resins in combination with vinyl ethers, vinyl silanes, styrenic compounds, or cinnamyl compounds.

Examples of epoxy resins include glycidyl ethers, such as those based on bisphenol A (commercially available from Resolution Technology) or bisphenol F (commercially available from CVC Specialty Chemicals of Maple Shade, N.J., under the designation 8230E, and from Resolution Performance Products LLC under the designation RSL1739); a blend of bisphenol-A and bisphenol-F (commercially available from Nippon Chemical Company under the designation ZX-1059; polyglycidyl ethers of phenol or cresol novolacs (commercially available from Vantico as EPN 1138); biphenyl epoxy resin (made by reaction of biphenyl resin with epichlorohydrin); epoxy resins based on dicyclopentadiene; epoxy resins based on naphthalene; epoxy functional butadiene/acrylonitrile copolymers; epoxy functional polydimethyl siloxane; cycloaliphatic epoxy resins (such as, 3,4-epoxycyclohexylmethyl-3,4-epoxycyclohexane carboxylate); vinylcyclohexene dioxide; 3,4-epoxy-6-methyl cyclohexyl methyl-3,4-epoxycyclohexane carboxylate; and dicyclopentadiene dioxide.

Other suitable resins for making sprayable adhesive include compounds with the following structures (in which $C_{34}$ is a linear or branched hydrocarbon chain with 34 carbon atoms):

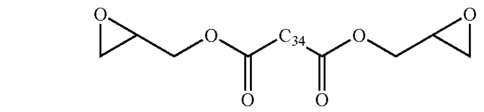

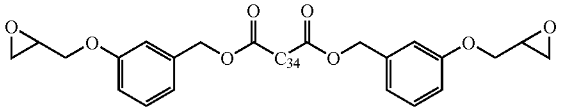

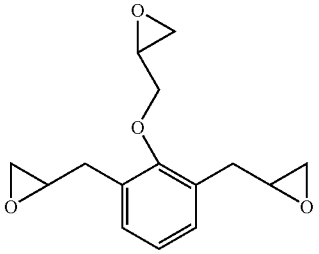

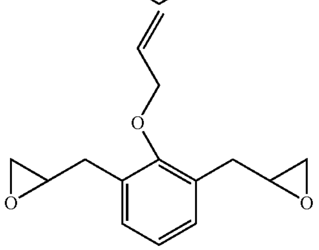

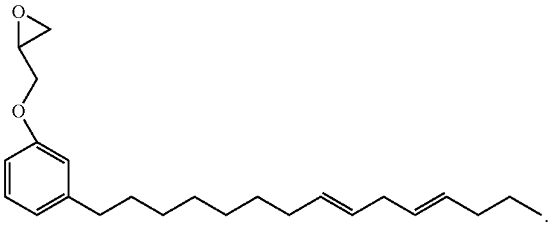

For these epoxy resins, a suitable catalyst, in addition to those commercially available, is an imidazole-anhydride adduct. Preferred imidazoles for forming the adduct include non-N-substituted imidazoles, such as, 2-phenyl-4-methyl imidazole, 2-phenyl imidazole, and imidazole. Other useful imidazole components for the adduct include alkyl-substituted imidazoles, N-substituted imidazoles, and mixtures of those.

Suitable acrylic resins include those available from Sartomer. Suitable bismaleimide resins include those available from Ciba Specialty Chemicals or National Starch. Suitable vinyl ethers and vinyl silanes are easily available commercially, for example, from Aldrich.

Suitable cinnamyl compounds for use in combination with maleimides include:

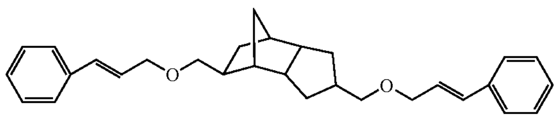

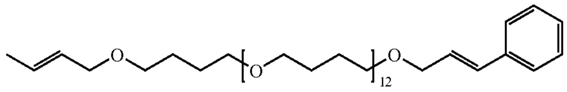

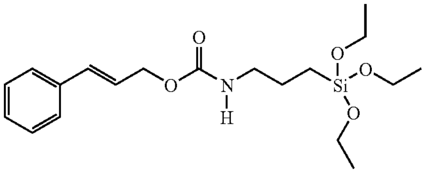

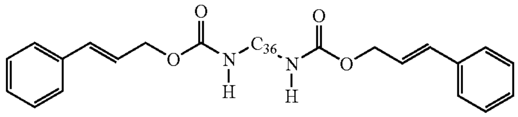

in which $C_{36}$ represents a linear or branched alkyl of 36 carbons derived from linoleic and oleic acids.

Suitable styrenic compounds for use in combination with maleimides include:

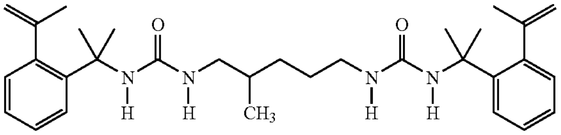

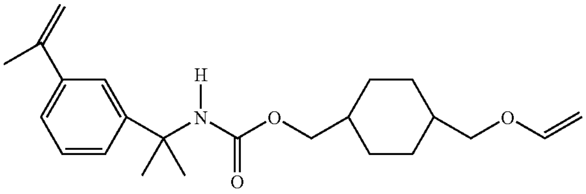

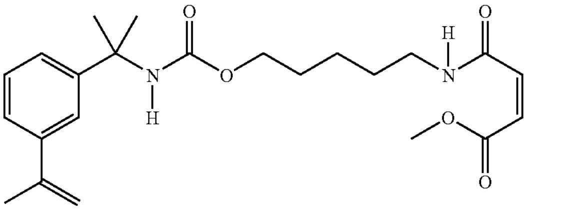

-continued

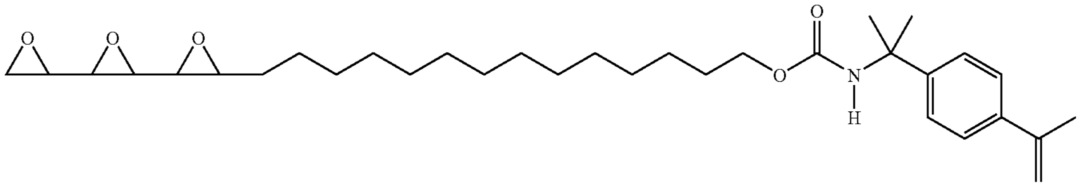

and

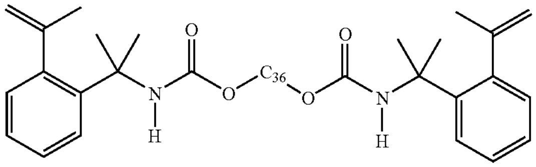

in which $C_{36}$ represents a linear or branched alkyl of 36 carbons derived from linoleic and oleic acids.

Curing agents such as free radical initiators, thermal initiators and photoinitiators will be present in an effective amount to cure the composition. In general, those amounts will range from 0.1% to 30%, preferably 1% to 20%, by weight of the total organic material (that is, excluding any inorganic fillers) in the composition. The actual cure profile will vary with the components and can be determined without undue experimentation by the practitioner. Suitable curing methods for the adhesive are thermal cures or radiation cures, such as UV curing.

Solvents can be utilized to modify the viscosity of the composition, and if used should be chosen so that they are compatible with the adhesive resin and so that they evaporate during curing of the resin. Examples of suitable solvents include 1-methoxy-2-propanol, propylene glycol methyl ether acetate, glycol ether, glycol acetate, glycol alcohol, and dipropylene glycol methyl ethyl ether. A workable viscosity range for the filled adhesive is 0.5 to 5.0 Pa.s, although the preferred viscosity is under 0.5 Pa.s.

The adhesive compositions may further comprise nonconductive or thermally or electrically conductive fillers. Suitable nonconductive fillers are particles of vermiculite, mica, wollastonite, calcium carbonate, titania, sand, glass, fused silica, fumed silica, barium sulfate, and halogenated ethylene polymers, such as, tetrafluoroethylene, trifluoroethylene, vinylidene fluoride, vinyl fluoride, vinylidene chloride, and vinyl chloride. Suitable conductive fillers are carbon black, graphite, gold, silver, copper, platinum, palladium, nickel, aluminum, silicon carbide, diamond, and alumina. If used, fillers generally will be present in amounts up to 90% by weight of the adhesive composition.

EXAMPLES

Two formulations were prepared as follows: Formulation A contained by weight 23% solid epoxy resin, 9% liquid epoxy resin, 10% phenolic hardener, 0.1% imidazole catalyst, 50% solvent, 0.1% silane adhesion promoter, 6.2% carbon black and 0.1% blue pigment (to enrich the black). Formulation A had a viscosity of 0.58 Pa.s. Formulation B contained by weight 22% solid epoxy resin, 9% liquid epoxy resin, 10% phenolic hardener, 0.5% imine catalyst, 49% solvent, 0.1% silane adhesion promoter, 6% carbon black, 3% titanium dioxide and 0.2% blue pigment. Formulation B had a viscosity of 0.33 Pa.s.

Formulations A and B were sprayed onto the inactive surface of a five inch silicon wafer using an Asymtek EFD 780S-ss spray head to a thickness of 50 μm. The adhesives were heated on the wafer for 10 minutes at 130° C. to evaporate the solvent and then cured by heating at 150° C. for 30 minutes. The wafer was then diced into four quadrants and each quadrant attached to a lead frame ball grid array semiconductor device. Each quadrant was marked with an identification mark using a Rofin sinar RSG 1010-4 laser at 18 A current, 680 mm/sec, 65 KHz. Legibility was good in all cases with differences between the marking and surface of the coating being the color and contrast of the mark.

What is claimed:

1. A method for laser marking the inactive surface of a semiconductor silicon die or wafer comprising (a) providing a sprayable adhesive composition having a viscosity within the range of 0.5 Pa.s to 5.0 Pa.s, containing at least one colored filler present in an amount up to 50% by weight of the adhesive composition, (b) spraying or jetting the adhesive composition onto the inactive surface of the semiconductor silicon die or wafer to a thickness within the range of 12.5 μm to 150 μm (c) curing the adhesive composition (d) marking the die or wafer by using a laser to bum or cut a mark or fiducial into the adhesive.

2. The method according to claim 1 in which the sprayable adhesive is an epoxy resin or a combination of an electron donor resin and an electron acceptor resin.

* * * * *